United States Patent
Chiola et al.

(10) Patent No.: US 7,754,550 B2
(45) Date of Patent: Jul. 13, 2010

(54) PROCESS FOR FORMING THICK OXIDES ON SI OR SIC FOR SEMICONDUCTOR DEVICES

(75) Inventors: Davide Chiola, Marina Del Rey, CA (US); Zhi He, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/885,378

(22) Filed: Jul. 6, 2004

(65) Prior Publication Data

US 2005/0009255 A1 Jan. 13, 2005

Related U.S. Application Data

(60) Provisional application No. 60/486,871, filed on Jul. 10, 2003, provisional application No. 60/494,224, filed on Aug. 8, 2003.

(51) Int. Cl.
*H01L 21/338* (2006.01)

(52) U.S. Cl. .................. 438/167; 438/570; 438/576; 438/770; 257/E51.009; 257/E33.051; 257/E27.068; 257/E21.163

(58) Field of Classification Search .................. 438/167, 438/570, 576, 770, FOR. 335, 637, 638; 257/E21.579, E51.009, E33.051, E27.068, 257/E21.163
See application file for complete search history.

(56) References Cited

U.S. PATENT DOCUMENTS

| | | | | |
|---|---|---|---|---|
| 4,666,556 A * | 5/1987 | Fulton et al. | ............... | 438/431 |
| 5,104,816 A * | 4/1992 | Verret et al. | ................ | 438/361 |
| 5,455,194 A * | 10/1995 | Vasquez et al. | ............ | 438/425 |
| 5,962,893 A | 10/1999 | Omura et al. | | |
| 6,136,664 A * | 10/2000 | Economikos et al. | ....... | 438/431 |
| 6,291,298 B1 | 9/2001 | Williams et al. | | |
| 6,351,018 B1 | 2/2002 | Sapp | | |
| 6,396,090 B1 | 5/2002 | Hsu et al. | | |
| 6,461,937 B1 * | 10/2002 | Kim et al. | ................... | 438/431 |
| 6,753,228 B2 * | 6/2004 | Azam et al. | ................ | 438/270 |
| 2001/0004543 A1 * | 6/2001 | Moore | ........................ | 438/402 |
| 2002/0125541 A1 * | 9/2002 | Korec et al. | ................. | 257/471 |
| 2002/0158284 A1 * | 10/2002 | Kim | .......................... | 257/316 |
| 2003/0040144 A1 * | 2/2003 | Blanchard et al. | ........... | 438/145 |
| 2003/0100168 A1 * | 5/2003 | Lee et al. | .................... | 438/424 |

(Continued)

FOREIGN PATENT DOCUMENTS

EP        1 191 603 A2    3/2002

(Continued)

OTHER PUBLICATIONS

Official Letter dated Nov. 20, 2006 in corresponding German Application No. 10 2004 032 910.9-33 (with English language translation).

*Primary Examiner*—Michelle Estrada
(74) *Attorney, Agent, or Firm*—Farjami & Farjami LLP

(57) ABSTRACT

The gate oxide in the trenches of a trench type Schottky device are formed by oxidizing a layer of polysilicon deposited in trenches of a silicon or silicon carbide substrate. A small amount of the substrate is also oxidized to create a good interface between the substrate and the oxide layer which is formed. The corners of the trench are rounded by the initial formation and removal of a sacrificial oxide layer.

9 Claims, 2 Drawing Sheets

U.S. PATENT DOCUMENTS

2003/0178673 A1 * 9/2003 Bhalla et al. ................ 257/330
2004/0058080 A1   3/2004 Kawasaki

FOREIGN PATENT DOCUMENTS

| JP | 04-326576 | 11/1992 |
| JP | 07-326660 | 12/1995 |
| JP | 2001-068688 | 3/2001 |
| JP | 2001-326273 | 11/2001 |
| JP | 2002-359378 | 12/2002 |
| WO | WO 02/31880 | 4/2002 |

* cited by examiner

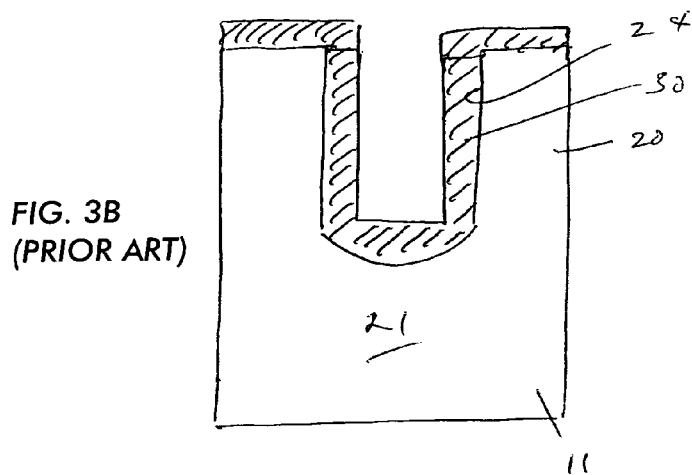
FIG. 3B (PRIOR ART)
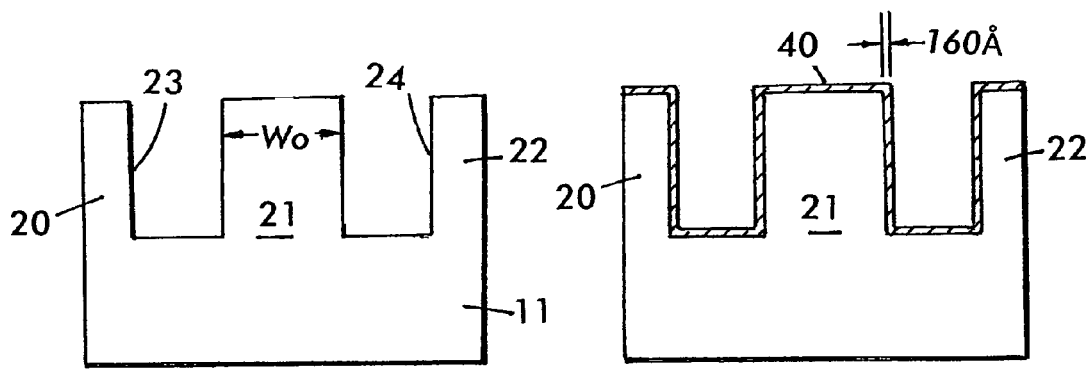
FIG. 3A (PRIOR ART)
FIG. 3C
FIG. 3D
FIG. 3E
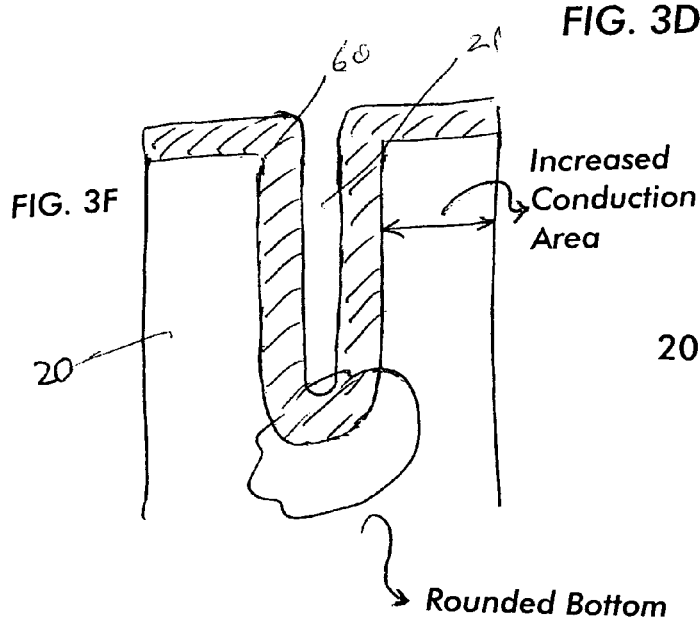
FIG. 3F
Rounded Bottom
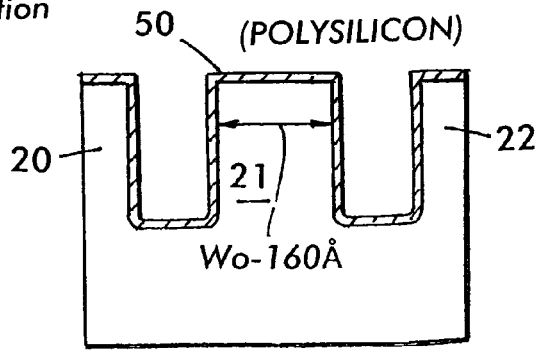

PROCESS FOR FORMING THICK OXIDES ON SI OR SIC FOR SEMICONDUCTOR DEVICES

RELATED APPLICATIONS

This application claims the benefit of U.S. Provisional Application No. 60/486,871, filed Jul. 10, 2003 and U.S. Provisional Application No. 60/494,224, filed Aug. 8, 2003.

FIELD OF THE INVENTION

This invention relates to semiconductor devices such as diodes, thyristors, Mosfets, IGBTs LEDs and the like, and more specifically relates to a novel process for forming oxide layers on a silicon or silicon carbide substrate underlying the oxide.

BACKGROUND OF THE INVENTION

Silicon dioxide layers are commonly thermally grown in the processing of semiconductor devices in which a silicon or silicon carbide surface is heated in a moist atmosphere to grow silicon dioxide (hereinafter frequently referred to as grown, or thermal, oxide).

This process reduces the surface thickness of an underlying substrate, which has been converted to silicon dioxide ($SiO_2$) and this is disadvantageous in many applications, for example, in trench type Schottky devices. Thus, in such devices, parallel trenches are formed in a silicon surface and the sides and bottoms of the trenches are oxidized by a thermal process to form an insulated $SiO_2$ coating in and lining each trench. Each trench is then filled with a conductive polysilicon. The silicon or silicon carbide, or other substrate material mesas between trenches have a critical width, and the process of growing the oxide on the trench walls will reduce the mesa widths by 2000 Å to 4000 Å, depending on the thickness of $SiO_2$ which is needed.

Further, the growth of oxide, particularly, on silicon carbide substrates is very time consuming and it would be desirable to form a grown oxide layer on SiC more quickly. For example, it will take 6.5 hr to grow 36 nm of oxide on SiC at 1100 C.

Furthermore, oxidation of SiC produces carbon clusters and a high density of trapped charges at the oxide/SiC interface. [See K. C. Chang, J. Bentley, L. M. Porter, J. of Ele. Mat. 32, 2003, 464-469; and Y. Hijikata, H. Yaguchi, M. Yoshikawa, S. Yoshida, Appl. Surf. Sci., 184 (2001) 161-166.] Thus, another long time post-oxidation annealing is normally used after the thermal oxidation. The quality of the oxide/SiC interface by thermal oxidation process therefore constrains the application of thermal grown oxide in the MOS device.

It would also be very desirable to form an $SiO_2$ insulation layer on a silicon parent substrate without excessive consumption of the silicon surface to create the $SiO_2$ layer.

BRIEF DESCRIPTION OF THE INVENTION

In accordance with the invention, the surface of a silicon or silicon carbide substrate which is to receive a grown $SiO_2$ layer or other film grown from the parent substrate is first coated with polysilicon of a given thickness. The polysilicon coating or layer is then completely converted to $SiO_2$ to form the layer. Preferably, the process continues until a very thin layer of the parent silicon or silicon carbide or other substrate is also converted to insure a clean interface of the converted oxide to the parent silicon or substrate.

BRIEF DESCRIPTION OF THE DRAWINGS

FIG. 3A shows the first step (trench etch) of a process for forming the trench Schottky of FIG. 2 or other trench device.

FIG. 3B shows the structure of FIG. 3A after the growth of an oxide layer in the trenches in the known prior art process.

FIG. 3C shows the first process step of the present invention in which a thin sacrificial oxide is first grown.

FIG. 3D shows the structure of FIG. 3C after the etching off of the sacrificial oxide FIG. 3E shows the structure of FIG. 3D after the deposition of a layer of polysilicon.

FIG. 3F shows the final structure in which the polysilicon layer of FIG. 3D has been converted to $SiO_2$.

DETAILED DESCRIPTION OF THE DRAWINGS

Figure 1:
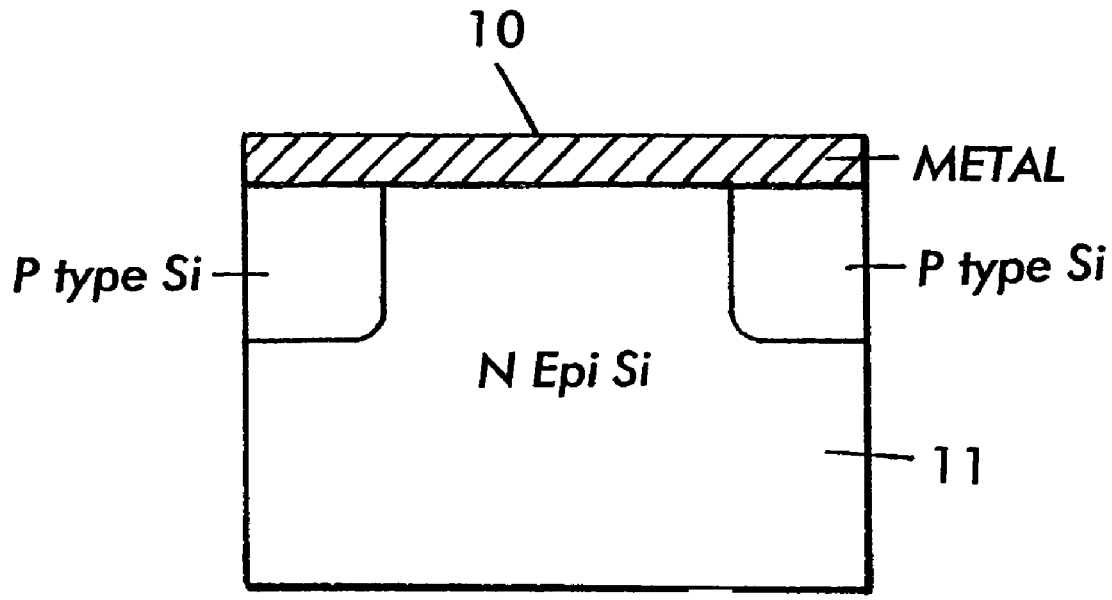
FIG. 1 is a cross-section of a small section of a conventional planar Schottky diode.

A conventional Schottky diode in the form of planar device is shown in FIG. 1. The rectifying performance of the device is controlled by the junction formed between the Schottky metal 10, such as molybdenum or the like and substrate 11, shown as an N type epitaxially grown layer and which may be silicon carbide or silicon. A bottom contact is then usually formed on the bottom of the N+ substrate (not shown) on which substrate 11 may be formed. Alternately, the silicon 11 may be float zone silicon (not epitaxially grown), or silicon carbide or the like.

Figure 2:
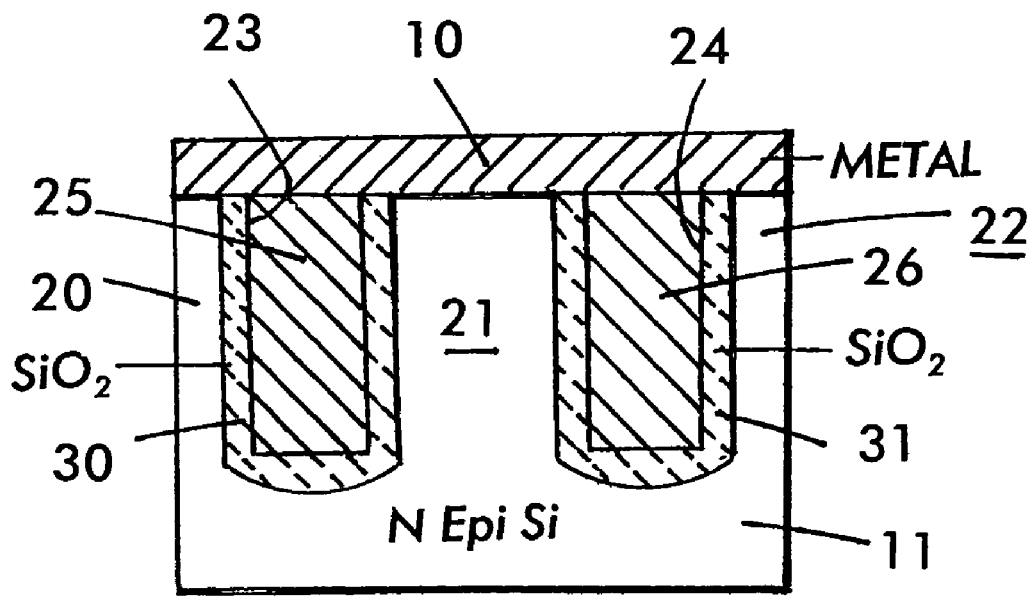
FIG. 2 is a cross section of a small section of a conventional trench Schottky diode.

In recent years, a trench Schottky has been developed. A typical trench Schottky structure is shown in FIG. 2. Mesa's 20, 21, 22 are separated by trenches 23, 24 and are filled with doped polycrystalline silicon masses 25, 26 respectively. The polysilicon is separated from the parent silicon 11, which may be epitaxially grown silicon, float zone silicon or silicon carbide, by a layer of oxide 30 and 31 in trenches 23 and 24 respectively. When a reverse bias is applied between the device anode and cathode and due to the MOS type structure at the trench side-walls, the mesas are easily pinched-off or depleted to turn off the conduction in channels 20, 21, 22. Thus, the trench Schottky device of FIG. 2 is characterized by better rectifying performance than the planar version of FIG. 1.

Normally, the trench structure is produced by forming a trench in the substrate layer by masking the silicon surface, opening windows in the mask, and then by a dry etch as shown in FIG. 3A, forming trenches 23 and 24.

The gate oxide layers 23, 24 are formed by thermally oxidizing the trench side wall of the silicon or SiC substrate 11. For a mid-voltage silicon device (60V-100V) a relatively thick Gate Oxide (2000 Å-4000 Å) is required to support the voltage. Hence, a large amount of the width of mesa regions 20, 21, 22 is consumed during the thermal oxidation process, causing a reduction of active area and higher forward voltage drop for the final device.

The present invention overcomes this drawback and provides better trench shape than the conventional method. The comparison of both methods is schematically shown in FIG. 3B and FIG. 3F for a silicon substrate. More generally, however, the invention provides a novel process for the production of a thermal oxide on a silicon, SiC surface or any other semiconductor substrate.

In FIG. 3C and following the formation of the trenches in FIG. 3A, a sacrificial oxidation process takes place forming a thin (160 Å) oxide layer 40 over the full exposed substrate surface. The sacrificial oxide 40 is etched away, adjusting the sharp corners at the trench bottom and to reduce the danger of oxide breakdown as shown in FIG. 3D. A thin layer of polysilicon 50 is then deposited or formed on the trench side-walls (FIG. 3E) of silicon or SiC substrate 11.

After deposition of polysilicon 50, a thermal oxidation process takes place (FIG. 3F), converting the layer of polysilicon until it is totally oxidized into $SiO_2$ layer 60, of any desired thickness, depending on the thickness of polysilicon layer 50.

A few hundred angstroms of oxide is also preferably produced by continued oxidization of the silicon or SiC substrate 11 surface to improve adherence of the oxide to the trench walls. However the much less oxide is grown in the process as compared to 4000 Å oxide formed in the conventional process of FIG. 3B. The conventional process consumes about 2000 to 3000 Å of the silicon substrate. In contrast, a negligible amount of substrate silicon is lost when using a process according to the present invention. Thus, more mesa area is retained in the novel process of FIGS. 3E and 3F and the forward drop of the resulting devices is reduced.

Beside the reduced substrate consumption and elimination of the sharp corners at the trench bottom, another benefit of growing gate oxide 60 by oxidizing polysilicon is that a more uniform oxide film is produced due to the good conformity of deposited polysilicon formed specially when an LVCVD process is employed. Thus, the nonuniformity of the gate oxide because of the different doping levels of the substrate can also be avoided. Moreover, oxide pinching at the trench bottom corners may be avoided.

After the step of FIG. 3F, the oxide 60 on the mesa surfaces is suitably removed, the trenches are filled with the conductive polysilicon as in FIG. 2 and the Schottky contacts 10 are formed as in FIG. 2.

It should be noted that although polysilicon is a preferred material, any other material which can be converted into a suitable dielectric in a chemical reaction, such as oxidation, may be used in a process according to the present invention.

Also, while the invention has been described in connection with the manufacture of a Schottky diode in a silicon or silicon carbide substrate, it will be understood that the process can be applied to any surface of a substrate which may be of other materials in which a dielectric film is formed from a deposited layer of another material and without consumption of the substrate material.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. The process for forming a trench type Schottky device comprising the steps of forming spaced trenches into the surface of a substrate each trench including sidewalls and a bottom; growing and then removing a thin layer of oxide in said trench to define rounded corners in the bottom of said trenches; depositing a layer of polysilicon directly on said sidewalls and said bottom of each trench; oxidizing said layer of polysilicon using a thermal oxidation process to convert it into a layer of an oxide of a given thickness; continuing said thermal oxidation process to oxidize a thin more than 100 Å thick layer of said substrate after the oxidation of said layer of polysilicon improving adherence of said converted layer of oxide; filling said trenches with a layer of conductive polysilicon which is insulated from said substrate by said layer of oxide, and applying a Schottky contact to the top of said substrate and in contact with the tops of the mesas between said trenches and with said conductive polysilicon in said trenches.

2. The process of claim wherein said substrate is monocrystalline silicon or silicon carbide.

3. A process for manufacturing a semiconductor device comprising:
   providing a semiconductor body;
   forming a plurality of spaced trenches in said semiconductor body, each trench including sidewalls and a bottom wall;
   thermally oxidizing at least said sidewalls of said trenches, and removing said oxidation to define rounded corners in the bottom of said trenches;
   growing a layer of convertible material that can be converted to an insulator directly on at least said sidewalls of said trenches;
   converting said convertible material to an insulator in a chemical reaction; and
   oxidizing a thin more than 100 Å thick portion of said semiconductor body below said convertible material after said converting of said convertible material to said insulator improving adherence of said insulator.

4. A process according to claim 3, wherein said semiconductor body is comprised of silicon.

5. A process according to claim 3, wherein said semiconductor body is comprised of SiC.

6. A process according to claim 3, further comprising forming a layer of said convertible material over said bottom of said trenches.

7. A process according to claim 3, wherein said convertible material comprises polysilicon.

8. A process according to claim 3, further comprising forming conductive bodies in said trenches.

9. A process according to claim 8, further comprising forming a schottky barrier in electrical contact with said conductive bodies in said trenches and in schottky contact with said semiconductor body.

* * * * *

UNITED STATES PATENT AND TRADEMARK OFFICE
CERTIFICATE OF CORRECTION

| | | |
|---|---|---|
| PATENT NO. | : 7,754,550 B2 | Page 1 of 1 |
| APPLICATION NO. | : 10/885378 | |
| DATED | : July 13, 2010 | |
| INVENTOR(S) | : Chiola et al. | |

It is certified that error appears in the above-identified patent and that said Letters Patent is hereby corrected as shown below:

In the claims, column 4, line 20, "claim wherein" should be changed to --claim 1, wherein--.

Signed and Sealed this
Twenty-ninth Day of November, 2011

David J. Kappos
*Director of the United States Patent and Trademark Office*